United States Patent [19]
May

[11] 3,946,215
[45] Mar. 23, 1976

[54] PSEUDO-RANDOM CODE GENERATOR
[75] Inventor: Jack L. May, Redmond, Wash.
[73] Assignee: The Boeing Company, Seattle, Wash.
[22] Filed: Sept. 30, 1974
[21] Appl. No.: 510,503

[52] U.S. Cl................................ 235/152; 331/78
[51] Int. Cl.......................... G06f 1/02; H03k 3/82
[58] Field of Search....................... 235/152; 331/78

[56] References Cited
UNITED STATES PATENTS

| | | | |
|---|---|---|---|
| 3,746,847 | 7/1973 | Maritsas.............................. | 235/152 |
| 3,811,038 | 5/1974 | Reddaway........................... | 235/152 |

Primary Examiner—R. Stephen Dildine, Jr.
Attorney, Agent, or Firm—Christensen, O'Connor, Garrison & Havelka

[57] ABSTRACT

A pseudo-random bit generator forms a portion of the pseudo-random code generator, and provides square wave output bits over a defined frequency spectrum on a plurality of parallel output lines. The bits present on a selected number of output lines in sequence define a binary number, which is compared with an accumulated count present in a counter driven by a clock running at a predetermined frequency. A correct comparison resets the counter, shifts the pseudo-random bit generator, and shifts a past-history shift register which contains a portion of the output of the pseudo-random code generator. The output from the past-history shift register, and the square wave output bits on certain other parallel output lines from the random bit generator are applied as inputs to respective logic probability circuits. The logic probability circuits are connected to an output logic circuit, the output of which is the pseudo-random code signal, a series of square waves occurring pseudo-randomly over a frequency spectrum which is adjustable by altering the parameters of the various logic probability circuits.

10 Claims, 2 Drawing Figures

PSEUDO-RANDOM CODE GENERATOR

BACKGROUND OF THE INVENTION

This invention relates generally to the art of random code generation, and more specifically concerns pseudo-random code generators which alter the output frequency spectrum of a pseudo-random bit generator to accomplish the pseudo-random code output.

Pseudo-random code generators of varying degrees of sophistication are well-known in the art. A common approach uses one or more shift registers with various combinations of feedback loops to provide a series of pseudo-random output bits. Since the bits are generated by a device operating on fixed feedback loop principles, the output of the device is only pseudo-random, i.e., the bit series will be repeated after a certain number of output bits have occurred. However, by selecting appropriate feedback combinations through special tables available in the art for a specified length of shift register, the random bit series may be quite extended. THe pseudo-random bit output of such devices using linear shift registers, however, occurs over a certain defined frequency spectrum. For different applications it may be desirable to change the frequency spectrum of the pseudo-random output. Conventional means for changing the output frequency spectrum of such a pseudo-random bit generator use output filters, although this technique has the significant disadvantage of distorting the square wave output so that it is no longer acceptable to drive follow-on logic circuits, or in other applications requiring a square wave signal.

In view of the above, it is a general object of the present invention to provide a pseudo-random code generator which overcomes the disadvantages of prior art code generators discussed above.

It is another object of the present invention to provide such a code generator which functions to shift the frequency spectrum of the output of a standard pseudo-random bit generator without distorting the waveform thereof.

It is a further object of the present invention to provide such a code generator which uses selected portions of the code generator output as feedback to influence the succeeding output of the code generator.

It is yet another object of the present invention to provide such a code generator in which the shift of frequency spectrum of the output of the code generator is controllable.

SUMMARY OF THE INVENTION

Accordingly, the present invention includes a first circuit which is operative to produce a plurality of first output bits which define a pseudo-random bit sequence. A probability-altering circuit, including at least one logic gating means responsive to more than one first output bit, is provided which has an output defining a first count. A clock circuit is provided for generating a clock signal having a predetermined frequency and a counter operative to count from a reference count is responsive to the clock signal. In operation, the counter count is continuously compared with the first count by a comparator circuit, and is operative to generate a comparator signal when the first count and the counter count are equal. The comparator signal is then used to reset the counter to the reference count, to produce a new pseudo-random bit sequence in the first circuit means, and to control a second circuit which is operative to produce the pseudo-random code signal, the level of magnitude of the code signal varying between at least two different levels in a pseudo-random manner, depending upon the pseudo-random bit sequence of the first circuit and the configuration of the probability-altering circuit and the second circuit.

More specifically, the second circuit includes a storage means which has a series of output connections, a portion of the output code signal being applied as an input to the storage circuit. A logic circuit is provided responsive to signals on the output connection of the storage means and to selected first output bits for shifting the magnitude of the output code signal.

DESCRIPTION OF THE DRAWINGS

A more thorough understanding of the invention may be obtained by a study of the following detailed description taken in connection with the accompanying drawings in which.

DESCRIPTION OF THE PREFERRED EMBODIMENT

Figure 1:
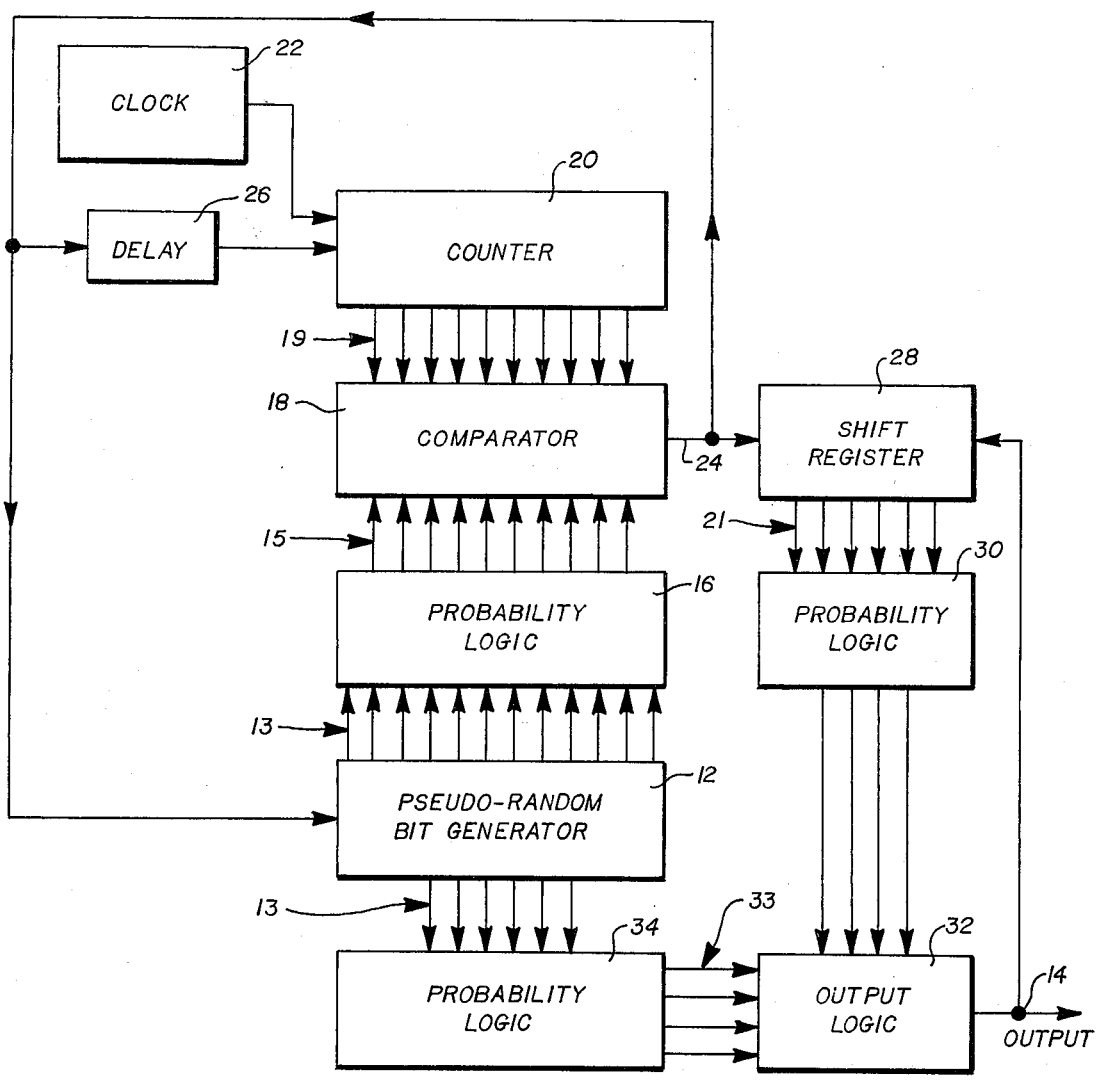
FIG. 1 is a block diagram of a preferred embodiment of the invention.

Referring to FIG. 1, a standard pseudo-random bit generator 12 provides square wave output bits on a plurality of parallel output lines 13.

The remainder of the circuit shown in FIG. 1 operates on the output bits of bit generator 12 to generate a square wave pulse train at code generator output connection 14 having a pulse width and pulse interval which varies pseudo-randomly to produce a selected output frequency spectrum which may differ from the frequency spectrum of the output of bit generator 12. The pseudo-random bit generator 12 is preferably a linear shift register which generates output signals on a plurality of parallel outputs 13, with each output signal having an equal probability of being a one or a zero. A selected number of the parallel outputs 13 from bit generator 12 are applied to probability logic circuit 16, which comprises a series of individual logic circuits corresponding in number to the number of logic output lines 15 from probability logic 16 to comparator 18. Each individual logic circuit in probability logic 16 is responsive to at least one input from the bit generator 12 to generate an output on one logic output line 15 to comparator 18, the combined signals on logic output lines 15 having a probability of being a one or a zero determined by probability logic 16.

The output lines 15 from the probability logic 16 are applied as a first set of parallel inputs to comparator 18. The signals present in the first set of parallel inputs define a first binary count. A second set of parallel inputs 19 to comparator 18 is provided by a counter 20 which comprises a plurality of series-connected bistable elements, the counter being driven by a clock 22 which is running at a predetermined rate. When the accumulated count in counter 20 reaches the value of the first binary count, comparator 18 generates a signal on comparator output line 24 which results in a shifting of the pseudo-random bit generator 12, and a resetting of the counter 20 after a time delay provided by delay circuit 26, which insures that pseudo-random bit generator 12 is shifted before counter 20 is reset. The output of comparator 18 is also applied as a shift input to past-history shift register 28 to which are applied as inputs those code generator output pulses which appear at circuit output connection 14 when the shift input from comparator 18 occurs. The past-history shift register 28 comprises a plurality of series-connected bistable elements, providing output signals on parallel output connections 21 to a probability logic circuit 30, which is similar in general concept to probability logic 16, but which has its own selected arrangement of individual logic circuits for output lines 31. The output lines 31 from probability logic 30 are applied as one set of inputs to output logic circuit 32. The other set of inputs to output logic 32 originates from the pseudo-random bit generator 12, with a certain number of the output lines thereof, other than those applied to probability logic 16, being applied to probability logic circuit 34, which is again similar in general concept to probability logic circuits 16 and 30, but which has its own selected configuration of individual logic circuits for output lines 33. Each of the output lines 33 from probability logic circuit 34 has a preselected probability of having a one or a zero impressed upon it, depending upon the configuration of the individual logic circuits associated with each output line 33, and the number of inputs thereto. Output logic circuit 32 combines the signals from probability logic circuits 30 and 34 to provide the square wave pseudo-random code output at circuit output connection 14. The selected signal portions of the output at 14 fed back to past-history shift register 28 and then through probability logic 30 are modified to increase code output signal randomness by the signals from probability logic 34. The pulse interval and duration of the signals at output 14 are determined by the immediate state of probability logic circuits 16, 30, 34 and the frequency of the clock 22. By altering the condition of these circuits relative to one another, the frequency spectrum and the randomness of the output signal at circuit output connection 14 may be conveniently altered while preserving the square wave waveform thereof.

Figure 2:
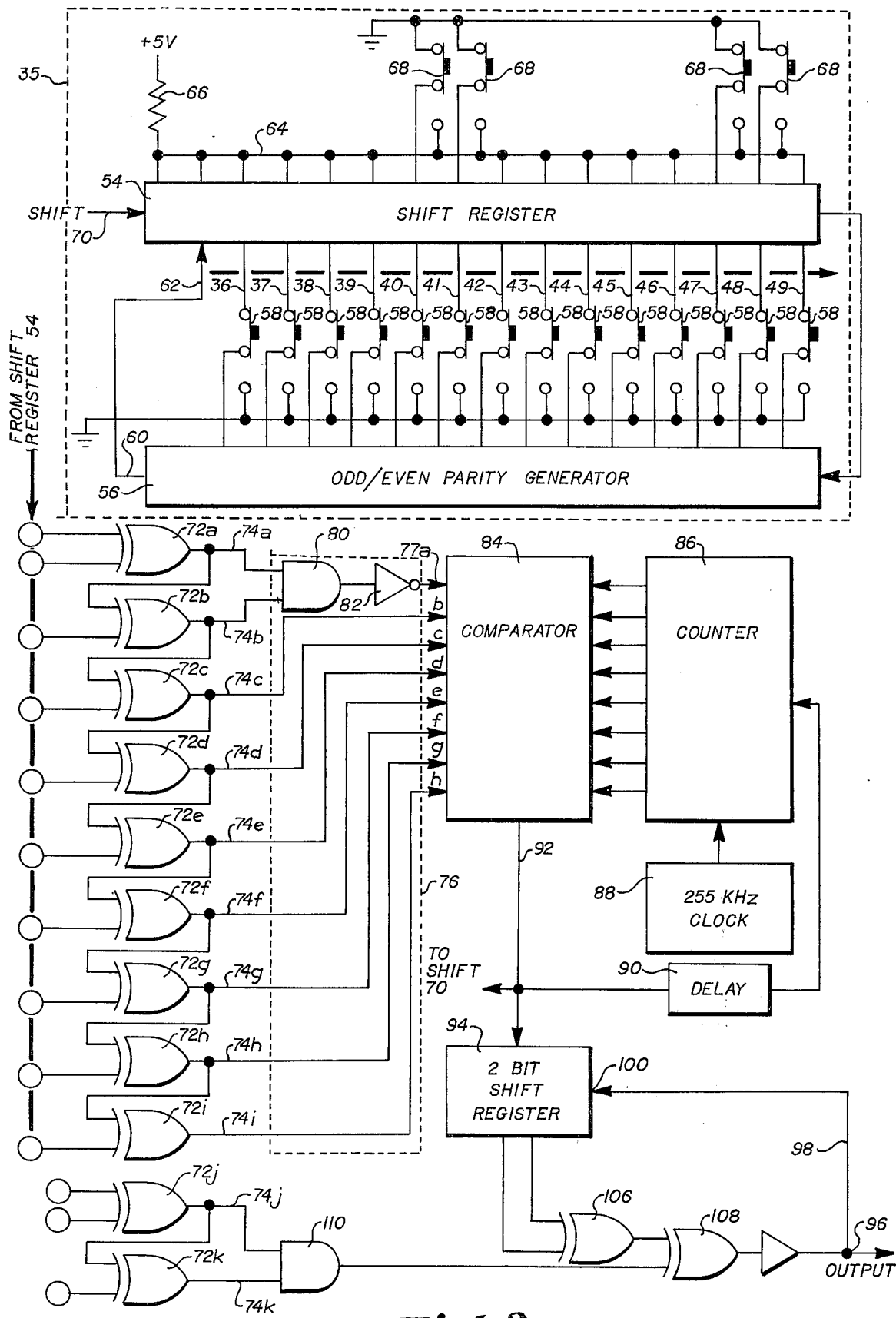
FIG. 2 is a schematic diagram of the preferred embodiment of the invention shown in block form in FIG. 1.

Referring now to FIG. 2, the pseudo-random bit generator 35 provides parallel logic one or logic zero outputs on output lines 36 through 49. A standard linear shift register 24 comprising a plurality of series-connected bistable elements provides the required plurality of parallel outputs. Selectively coupling each output of linear shift register 54 to an odd/even parity generator 56 are a plurality of individually controllable slide switches 58 which, in a first position, connect the respective lines 36 through 49 of the linear shift register 54 to the inputs of parity generator 56, and in a second position connect the inputs of the parity generator 56 to ground. In operation, the parity generator 56 sums the signals on those lines from linear shift register 54 which are connected to it by selected slide switches 58 being in their first position, and then generates a parity signal on parity generator output line 60. The parity signal is a logic one if the sum of the logic signal levels from shift register 54 is even, and generates a zero if the sum of the logic levels is odd. The parallel arrangement of linear shift register and odd/even parity generator results in a probability of one-half that each output of shift register 54 will be a one or a zero.

The parity signal is applied to the input connection 62 of shift register 54 at the time that the shift register 54 is shifted. The parity generator 56 thus generates the new bits which are serially shifted into the shift register 54. The pseudo-random pattern of the bits present at parity generator output line 60 is determined by the position of slide switches 58. Each permutation of the overall positional condition of slide switches 58 will result in a different pseudo-random sequence at the output line 60. Tables of pseudo-random sequences corresponding to shift register lengths and slide switch positions have been computed and are well-known in the art, and thus a particular sequence may be generated by referring to these tables.

The initial condition of each bistable element in shift register 54 is established by a 5 volt initialize line 64 connected through resistor 66. When initialize line 64 is connected to a bistable element, a logic one is initially displayed at the output of that element. Several of the bistable elements in shift register 54 may be connected to the initialize line 64 through slide switches 68. This provides a capability of selectively varying the initial condition of the shift register 54. Any combination of the series-connected bistable elements may be connected to the initialize line 64 through sliide switches 68, depending upon the desires of the operator.

In operation, shift register 54 will remain in its initial condition until a shift command is applied on shift input line 70. When a shift command is received, the parity signal from odd/even parity generator 56 is applied to the input 62 of shift register 54. The information already present in the shift register will simultaneously be shifted one position to the right, the information previously existing in the last position to the right being shifted out of the shift register 54.

In the preferred embodiment a selected number of outputs of linear shift register 54 defining a first output sequence are connected in sequence to a first plurality of exclusive OR gates 72a through 72i, while other outputs thereof, defining a second output sequence are connected in sequence to a second plurality of exclusive OR gates 72j through 72k. Preferably, the first two outputs of linear shift register 54 in each output sequence are applied to the two inputs, respectively, of the first exclusive OR gate in the respective first and second pluralities of exclusive OR gates. Thereafter, the output of each exclusive OR gate is applied as one input to the next successive exclusive OR gate, the other input being the signal on the next successive output line in the sequence from shift register 54. The exclusive OR gates 72a through 72k, although not mandatory for proper operation of the circuit, tend to make the bit signal present on any one of exclusive OR gate output lines 74a through 74k statistically independent of the other gate output lines, so that it becomes impossible to predict what the condition of the other gate output lines are if the statistical properties of one or more gate output lines are known. This is accomplished by using $n + 1$ output lines from linear shift register 54 to generate an $n$ number of gate outputs for each plurality of exclusive OR gates. The outputs of exclusive OR gates 72a through 72k are applied on gate output lines 74a through 74k, with gate output lines 74a through 74i being applied to a first probability logic circuit 76 and gate output lines 74j and 74k being applied to a second probability logic circuit, comprising in the preferred embodiment NAND gate 110. Other numbers of gate output lines may, of course, be used, depending upon the application.

As explained above, the probability of each output 36 through 49 of shift register 54 being a logic one or a logic zero is one-half, and hence outputs 74a through 74k also have a probability of one-half of being a one or a zero. The probability logic circuit 76 uses inputs 74a through 74i to generate signals on a plurality of output lines 77a through 77h, each output line having a probability of a one or zero determined by the individual logic circuit associated therewith in probability logic circuit 76. In the preferred embodiment, output lines 74a and 74b from exclusive OR gates 72a and 72b are applied as inputs to a NAND gate 80, the output of which is applied to an inverter 82. The output of the inverter 82 is applied on output line 77a as one input to a comparator 84. The probability of the output signal from inverter 82 being a one is hence three-out-of-four and the probability of a zero one-out-of-four, due to the operation of NAND gate 80 in response to two equal probability inputs. Output lines 74c through 74h are all applied directly as inputs to comparator 84, and thus the probability of each of those output lines is equal between one and zero. Different configurations of probability logic circuits may be used depending upon the frequency spectrum to be generated at the output of the code generator.

The other input to the comparator 84 is from counter 86, which is driven by a 255 KHz clock 88. The length of the counter 86 and the frequency of the clock 88 both have a significant effect on the frequency spectrum of the output pseudo-random code signal. In the preferred embodiment, for purpose of clarification, the criteria has been established that successive shifts of the code generator must occur within 1 millisecond. That is, the interval between successive zero crossings, where a logic one is defined as being above the zero or reference line, and a logic zero below the reference line, must be no greater than one millisecond. The 1 millisecond interval has been selected for purposes of illustration in the preferred embodiment. Such an interval does, however, have significant advantages when the code generator is used as a frequency scrambler. Using the 1 millisecond interval and proper filtering, the output of the pseudo-random code generator becomes sufficiently "smeared" such that it is not easily reconstructed with an oscilloscope or similar equipment. It should be understood, however, that intervals other than 1 millisecond can easily be used.

Assuming for purposes of explanation that the interval between code generator shifts has been determined to be never more than one millisecond, the frequency of the clock 88 relative to the length of the counter 86 and the number of inputs from the probability logic 76 to the comparator 84 must be chosen such that counter 86 can count up the maximum count represented by the input signals from probability logic 76 within the 1 millisecond interval. Thus, for the preferred embodiment shown in FIG. 2, there are eight inputs to the comparator 84 from probability logic 76, and eight inputs from counter 86, indicating that counter 86 must be at least 8 bits in length and that 256 counts are necessary to cycle the counter 86 through every possible count from probability logic 76. In accordance with preferred eight bit counter 86, the frequency of clock 88 is chosen to be 255 KHz, so that within 1 millisecond, 255 pulses will be generated by clock 88 and hence, that counter 86 will count completely through one cycle within the prescribed 1 millisecond interval. The counter 86 counts until the count established from probability logic 76 is reached.

Line 77a contains the most significant digit in the binary count from probability logic circuit 76, while line 77h the least significant digit. Thus, the probability of a one on input line 77a determines the relative probabilities of the zero crossing or generator shift occurring within the first half or last half of the 1 millisecond interval. Since in the preferred embodiment, the probability of a one on line 77a is three-out-of-four, the probability then that the zero crossing will occur in the first half of the 1 millisecond interval is one-quarter, while the probability that the zero crossing will occur in the last half is three-quarters, because the signal on line 77a represents the most significant digit in the count from probability logic 76. The 1 millisecond interval is divided successively by two by lines 77b through 77h, for a total of 255 discrete segments. Since there are 255 possible discrete time slots within the 1 millisecond interval for an 8 bit counter, each increment or time slot in the first half millisecond will in the preferred embodiment have a probability of 0.5/255 of the zero crossing occurring therein, while each time slot in the last half of the 1 millisecond interval will have a probability of 1.5/255 that the zero crossing will occur in that portion. The probability of the zero crossing occurring in any one of the segments is thus adjustable by changing the configuration of probability logic circuit 76.

When a correct comparison occurs between the count from counter 86, and the count from probability logic 76, the comparator 84 generates an output on comparator output line 92. This comparator output signal is applied to the shift input 70 of the shift register 54, resulting in a shifting of the information contained therein one position to the right, and a new bit from parity generator 56 being applied to the lefthandmost position of shift register 54, as explained above.

The output signal from comparator 84 is also applied, after a short time delay due to delay 90, to counter 86, and the comparison process explained above is repeated. The output signal from comparator 84 is also applied as a shift input to a two-bit past-history shift register 94. The input to shift register 94 is taken from circuit output connection 96 and applied on feedback line 98 to the input 100 of shift register 94. The pulse information which is at the circuit output connection 96 at the time coincident with the occurrence of a shift pulse from comparator 84, is applied on feedback line 98.

The shift register 94 has its two output bits connected to a third probability logic circuit. This circuit comprises in the preferred embodiment an exclusive OR gate 106. The output of exclusive OR gate 106 is then applied as one input to exclusive OR gate 108 which forms the output logic circuit in the preferred embodiment. It should, of course, be recognized that shift register 94 may be various bit lengths, and that the third probability logic circuit may comprise a plurality of gate circuits, again depending on the circuit application.

Outputs 74j and 74k from exclusive OR gates 72j and 72k are provided as inputs to a second probability logic circuit, which in the preferred embodiment NAND gate 110, which provides a three-out-of-four probability that a one will appear at the output thereof and a one-out-of-four probability that a zero will occur at the output thereof. The output of NAND gate 110 is applied as the other input to exclusive OR gate 108, which is the output logic circuit in the preferred embodiment. The effect of the output from NAND gate 110 on the output of exclusive OR gate 108 is to provide a probability of three-out-of-four that the output of exclusive OR gate 106 (third probability logic circuit) will be present at the output connection 96 and a one-out-of-four probability that the output of the exclusive OR gate 106 will be changed. This probability may, of course, be altered by altering the configuration of the second probability logic circuit, shown in FIG. 2 as a two-input NAND gate 110. The effect of NAND gate 110 (the second probability logic circuit) is to add a degree of randomness to the selected past-history at the circuit output connection 96 which is present in shift register 100. Without the introduction of the signal from NAND gate 110, the output from exclusive OR gate 106 tends to have a relatively short cycle before it repeats. NAND gate 110 acts to disrupt the periodicity of the signal from exclusive OR gate 106, and tends to spread it out in accordance with the randomness of its own output. The outputs from exclusive OR gate 106 and NAND gate 110 are applied as inputs to exclusive OR gate 108, the output of which is the pseudo-random code output of the circuit, having a frequency spectrum which can be altered by varying the logic functions of the first, second and third probability logic circuits. It should be understood that both the second and third probability logic circuits can be configured to have multiple outputs, with the output logic circuit accomodating the plurality of inputs thereto with a complex gate configuration to provide the pseudo-random output signal. Such changes in the configuration of the individual probability output circuits are within the ordinary skill of the art, and would depend upon the application of the code generator.

Thus, pseudo-random code generator has been disclosed which utilizes a well-known random bit generator in the form of a linear shift register and parity generator, with the code generator of the present invention having the capability of altering the frequency spectrum of the output of the random bit generator in accordance with the desires of the operator, without distorting the square wave output, so that the output of the pseudo-random code generator can be used to drive follow-on logic circuits or the like.

It should, or course, be understood that configurations of random bit generators other than that specifically disclosed above can be effectively utilized, as well as different specific configurations of the probability determining logic circuits, the length of the counter, and the frequency of the clock. It should be recognized, however, that the rate of the clock, the length of the counter, and the number of inputs to the comparator from the first probability determining logic circuit must be controlled in accordance with a specified time period so as to provide proper control over the randomness and the frequency spectrum of the square wave output signals of the circuit. It should also be understood that other possible changes, modifications, and substitutions may be incorporated in the embodiments specifically disclosed herein without departing from the spirit of the invention as defined by the claims which follow:

What is claimed is:

1. An apparatus for generating a pseudo-random code signal, comprising:

first circuit means operative to produce a plurality of first output bits which define a pseudo-random sequence;

at least one logic gating means responsive to more than one of said first output bits, said logic gating means providing a logic output bit, said logic output bit and selected other first output bits defining a first count;

clock means generating a clock signal of predetermined frequency;

counter means responsive to said clock signal and operative to count from a reference count;

means operative to compare the count of said counter means with said first count, and to generate a comparator signal in response to an equality therebetween;

means responsive to said comparator signal for resetting said counter means to said reference count;

means coupling said comparator signal to said first circuit means, said first circuit means producing in response to said comparator signal a new pseudo-random bit sequence; and, means controlled by said comparator signal to produce successive second output bits defining the pseudo-random code signal.

2. An apparatus of claim 1, wherein said second output bit producing means includes storage means having a series of outputs, and means for applying a portion of said code signal to said storage means, and further includes second logic means responsive to said storage means outputs, and to selected ones of said first output bits for producing successive output bits under the control of said comparator signal.

3. An apparatus of claim 2, wherein said storage means is a linear shift register, and wherein said linear shift register is responsive to said comparator signal to enter the portion of the code signal then presented to said storage means by said applying means.

4. An apparatus of claim 1, wherein said counter means has a counting cycle at least equal to the largest possible first count.

5. An apparatus of claim 1, wherein said first output bits are square waves, and wherein the code signal is a square wave signal.

6. An apparatus of claim 1, wherein said first circuit means includes a linear shift register having an input and output, and an odd/even parity generator, wherein said linear shift register is in parallel connection with said odd/even parity generator, wherein said odd/even parity generator is responsive to selected ones of said first output bits to produce a bit series, the bits in said bit series being applied to the input of said linear shift register in response to said comparator signal.

7. An apparatus of claim 6, wherein said odd/even parity generator is operative to sum the number of selected first output bits having a first magnitude, and to produce a bit having a first magnitude when said sum is even, and a second magnitude when said sum is odd.

8. An apparatus of claim 6, including means for selectively coupling each of said first output bits to said odd/even parity generator.

9. An apparatus of claim 1, including means for delaying the resetting of said counter means until said new pseudo-random bit sequence has been produced.

10. An apparatus for generating a pseudo-random code signal, comprising:

first circuit means operative to produce a plurality of first output bits which define a pseudo-random sequence, each of said first output bits varying between two levels of magnitude according to a known first probability;

second circuit means responsive at its input to selected first output bits for generating a plurality of counter input bits, at least one of which varies between two levels of magnitude according to a probability different than said known first probability, said counter input bits defining a first count;

clock means generating a clock signal of predetermined frequency;

counter means responsive to said clock signal and operative to count from a reference count;

means operative to compare the count of said counter means with said first count, and to generate a comparator signal in response to an equality therebetween;

means responsive to said comparator signal for resetting said counter means to said reference count;

means coupling said comparator signal to said first circuit means, said first circuit means producing in response to said comparator signal a new pseudo-random bit sequence; and, means controlled by said comparator signal to produce successive second output bits defining the pseudo-random code signal.

* * * * *